(12) United States Patent
Jung

(10) Patent No.: US 8,163,654 B2
(45) Date of Patent: Apr. 24, 2012

(54) METHOD FOR FABRICATING FINE PATTERN IN SEMICONDUCTOR DEVICE

(75) Inventor: Jin-Ki Jung, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 12/962,307

(22) Filed: Dec. 7, 2010

(65) Prior Publication Data

US 2011/0076851 A1    Mar. 31, 2011

Related U.S. Application Data

(62) Division of application No. 12/237,972, filed on Sep. 25, 2008, now Pat. No. 7,867,913.

(30) Foreign Application Priority Data

Sep. 28, 2007 (KR) ......................... 10-2007-0098321

(51) Int. Cl.
  *H01L 21/302* (2006.01)
  *H01L 21/31* (2006.01)
  *H01L 21/469* (2006.01)

(52) U.S. Cl. ........ 438/725; 438/780; 438/783; 438/798; 438/924; 257/E21.249

(58) Field of Classification Search .................. 438/725, 438/780, 783, 798, 924; 257/E21.249
  See application file for complete search history.

(56) References Cited

U.S. PATENT DOCUMENTS

| | | | |
|---|---|---|---|
| 5,277,749 A * | 1/1994 | Griffith et al. .................. | 216/40 |
| 5,545,512 A * | 8/1996 | Nakato ......................... | 430/323 |
| 5,659,450 A * | 8/1997 | Saito ......................... | 360/123.25 |
| 6,271,154 B1 * | 8/2001 | Shen et al. .................... | 438/725 |
| 6,844,143 B2 * | 1/2005 | Lin et al. ....................... | 430/317 |
| 6,864,144 B2 | 3/2005 | Kenyon et al. | |
| 2003/0111098 A1 | 6/2003 | Kim | |

FOREIGN PATENT DOCUMENTS

| | | |
|---|---|---|
| JP | 61-032524 | 2/1986 |
| JP | 04-254320 | 9/1992 |
| JP | 10-069096 | 3/1998 |
| KR | 1998-060617 | 10/1998 |
| KR | 1019990055782 | 7/1999 |
| KR | 100301654 | 8/2000 |
| KR | 1020020039956 | 5/2002 |
| KR | 100653534 | 11/2006 |

OTHER PUBLICATIONS

IBM technical Disclosure Bulletin, "Lift-off Process Using Chemical Blowing Agents in Manufacturing Chip Packaging Structures" Feb. 1998 vol. 30, issue 9 pp. 156-157.*
Korean Notice of Allowance for 10-2008-0094723, citing the above reference(s).
Korean Office Action for application No. 10-2008-0094723, citing the above reference(s).

* cited by examiner

*Primary Examiner* — Charles Garber
*Assistant Examiner* — Ron Pompey
(74) *Attorney, Agent, or Firm* — Lowe Hauptman Ham & Berner LLP

(57) ABSTRACT

A method for fabricating a fine pattern in a semiconductor device includes forming a first photoresist over a substrate where an etch target layer is formed, doping at least one impurity selected from group III elements and group V elements, of the periodic table, into the first photoresist, forming a photoresist pattern over the first photoresist, performing a dry etching process using the photoresist pattern to expose the first photoresist, etching the first photoresist by an oxygen-based dry etching to form a first photoresist pattern where a doped region is oxidized, and etching the etch target layer using the first photoresist pattern as an etch barrier.

8 Claims, 7 Drawing Sheets

METHOD FOR FABRICATING FINE PATTERN IN SEMICONDUCTOR DEVICE

CROSS-REFERENCE(S) TO RELATED APPLICATIONS

The present application is based on and claims priority from, Korean patent application number 10-2007-0098321, filed on Sep. 28, 2007, and is a Divisional of parent application Ser. No. 12/237,972, filed on Sep. 25, 2008, the disclosure of which is hereby incorporated by reference herein its entirety.

BACKGROUND OF THE INVENTION

The disclosed embodiments relate to a semiconductor fabrication technology, and more particularly to a method for fabricating a fine pattern in a semiconductor device.

As a semiconductor device is becoming highly integrated, a thickness and height difference of an etching target layer during a photolithography process are increasing. In order to pattern such a thick etching target layer, a photoresist used as an etch mask should be sufficiently thick. However, it is difficult to form the photoresist thickly and it is difficult to meet conditions such as depth of focus (DOF) during an exposure process in accordance with increasing for the thickness of the photoresist pattern.

Therefore, in the photolithography process for patterning a thick material layer just like a contact hole forming process, technologies have been introduced which use a material layer having a low etch selectivity with respect to the photoresist as a hard mask.

Meanwhile, among hard mask materials, amorphous carbon is mostly considered because of a low etch selectivity with respect to an insulation layer such as a silicon oxide layer.

FIGS. 1A to 1D illustrate a typical method for fabricating a fine pattern.

Referring to FIG. 1A, an amorphous carbon layer 12 having a thickness of approximately 2,000 Å to approximately 4,000 Å is formed over a substrate 10 where an interlayer insulation layer 11 such as a silicon oxide layer is formed as an etch target layer. A silicon oxynitride layer (SiON) 13 having a thickness of approximately 400 Å to approximately 600 Å is formed over the amorphous carbon layer 12. An organic bottom anti-reflective coating (BARC) 14 is formed over the silicon oxynitride layer 13, and a photoresist 15 having a thickness of approximately 10,000 Å is formed over the bottom anti-reflective coating 14.

Referring to FIG. 1B, a photoresist pattern 15A is formed by sequentially performing a soft bake process, an exposure process using a photo mask, a post-exposure bake (PEB) process, and a development process.

Referring to FIG. 1C, an $O_2$ plasma etching process is performed to pattern up to the amorphous carbon layer 12. Reference numerals 13A and 12A represent a patterned silicon oxynitride layer and a patterned amorphous carbon layer, respectively. The photoresist pattern 15A and the bottom anti-reflective coating 14 are removed during the $O_2$ plasma etching process. During this process, the silicon oxynitride layer 13A serves to prevent damage of the amorphous carbon layer 12A.

Referring to FIG. 1D, a dry etching process is performed on the interlayer insulation layer 11 using the amorphous carbon layer 12A as an etch mask. Therefore, interlayer insulation patterns 11A are formed, then the remaining silicon oxynitride layer 13A and amorphous carbon layer 12A are removed.

If a fine pattern forming process is performed using the amorphous carbon layer as a hard mask, it is possible to ensure an excellent profile of the fine pattern due to the low etch selectivity of the amorphous carbon layer.

However, since the amorphous carbon layer is formed by not a coating method but a deposition method, it is deposited all over the wafer. Therefore, it is necessary to perform a bevel etching process for removing the amorphous carbon layer formed on an edge portion of the wafer.

Furthermore, since the amorphous carbon layer has a very high light absorption, it is necessary to open an alignment key for a mask alignment in an exposure apparatus. During the mask alignment, a method for irradiating light and detecting a reflected secondary light is used. However, as described above, since the amorphous carbon layer has the very high light absorption, it is difficult to detect the alignment key. Therefore, it is necessary to perform an additional mask process and etching process for removing the amorphous carbon layer formed on the alignment key after forming the amorphous carbon layer.

SUMMARY OF THE INVENTION

Embodiments herein are directed to provide a method for fabricating a fine pattern in a semiconductor device, which is capable of ensuring an etching profile without using a hard mask material.

In accordance with one of the embodiments, there is provided a method for fabricating a fine pattern in a semiconductor device. The method includes forming a photoresist over a substrate where an etch target layer is formed, exposing the photoresist, doping one impurity selected from group III and group V into the photoresist, exposing the photoresist to form a photoresist pattern, performing an oxidation process to oxidize a doped region of the photoresist, and etching the etch target layer using the photoresist pattern, where the doped region is oxidized, as an etch barrier.

In accordance with another embodiment, there is provided a method for fabricating a fine pattern in a semiconductor device. The method includes forming a first photoresist over a substrate where an etch target layer is formed, doping at least one impurity selected from group III and group V into the first photoresist, forming a photoresist pattern over the first photoresist, performing a dry etching process using the photoresist pattern to expose the first photoresist, etching the first photoresist by an oxygen-based dry etching to form a first photoresist pattern where a doped region is oxidized, and etching the etch target layer using the first photoresist pattern as an etch barrier.

In accordance with yet another embodiment there is provided a method for fabricating a fine pattern in a semiconductor device. The method includes forming a first photoresist over a substrate where an etch target layer is formed, doping one impurity selected from group III and group V into the first photoresist, performing an oxidation process to oxidize a doped region of the photoresist, forming a photoresist pattern over the first photoresist, patterning the first photoresist using the photoresist pattern as an etch barrier, and etching the etch target layer using the first photoresist pattern, where the doped region is oxidized, as an etch barrier.

DETAILED DESCRIPTION OF SPECIFIC EMBODIMENTS

In the following detailed description, for purposes of explanation, numerous specific details are set forth in order to provide a thorough understanding of the present invention. It will be apparent, however, that the present invention may be practiced without these specific details. Hereinafter, disclosed embodiments will be described with reference to the accompanying drawings.

Figure 1A:
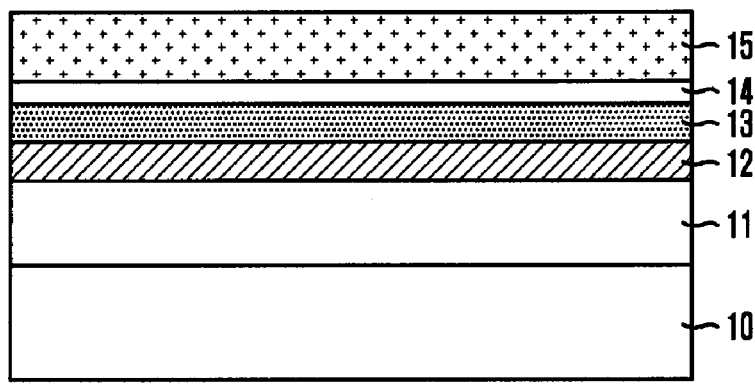
FIGS. 1A to 1D illustrate a typical method for fabricating a fine pattern.
Figure 1B:
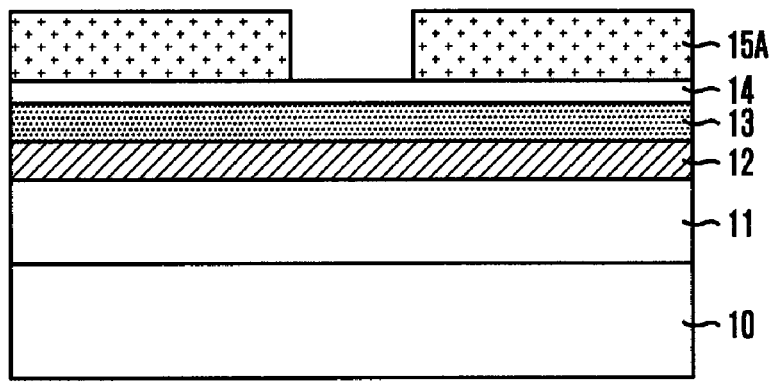
Figure 1C:
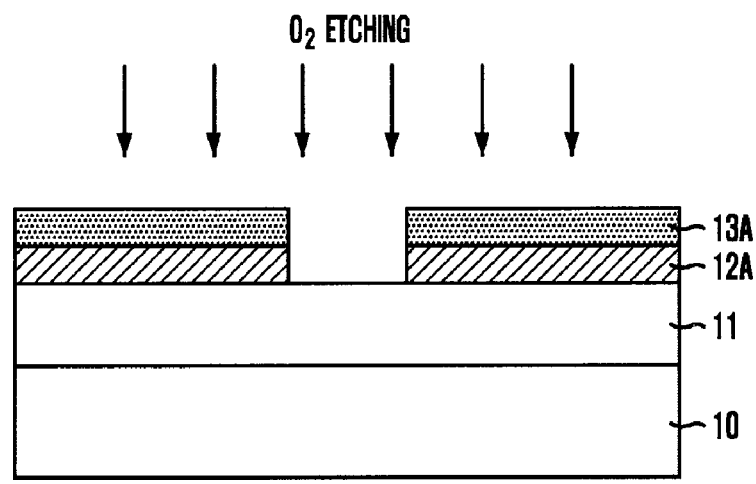
Figure 1D:
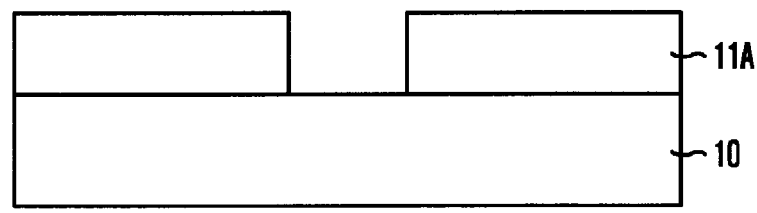
Figure 2A:
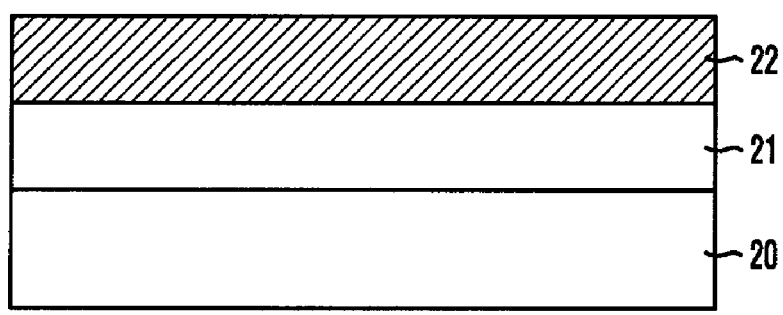
FIGS. 2A to 2D illustrate a method for fabricating a fine pattern in accordance with an embodiment of the present invention.

Referring to FIG. 2A, after a predetermined process is completed, a photoresist 22 is formed over a substrate 20 where an interlayer insulation layer 21 such as a silicon oxide layer or a silicon nitride layer is formed as an etch target layer. Before forming the photoresist 22, an organic bottom anti-reflective coating may be additionally formed.

Figure 2B:
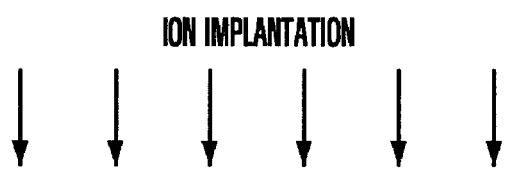
Figure 2B:
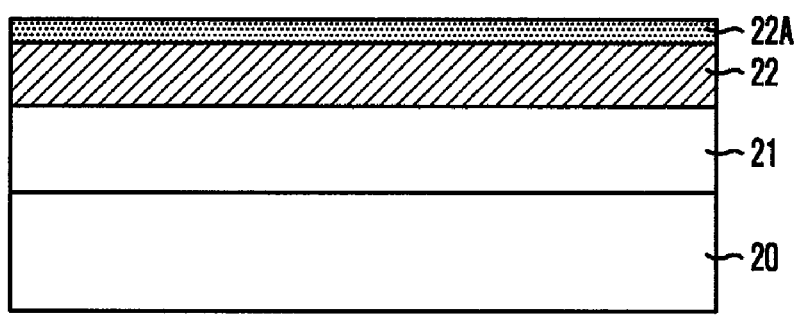

Referring to FIG. 2B, an exposure process is performed and at least one impurity selected from the group consisting of boron (B) (a group III element of the periodic table), indium (In) (a group III element of the periodic table), phosphorus (P) (a group V element of the periodic table), and arsenic (As) (a group V element of the periodic table) is implanted into the photoresist 22. In this case, a dose of the impurity is more than approximately $1*10^{13}/cm^2$, and ion implantation energy is more than approximately 5 KeV. After the ion implantation, an annealing process may be performed for diffusing dopants. If a rework is required due to a mask pattern defect during the exposure process, a doped region 22A can be removed by a high temperature piranha cleaning process. The high temperature piranha cleaning process is performed at a temperature higher than approximately 120 and using a gas mixture of $H_2SO_4$ and $H_2O_2$ having a mixture ratio of $H_2SO_4$ and $H_2O_2$ approximately 3:1 to approximately 4:1.

Figure 2C:
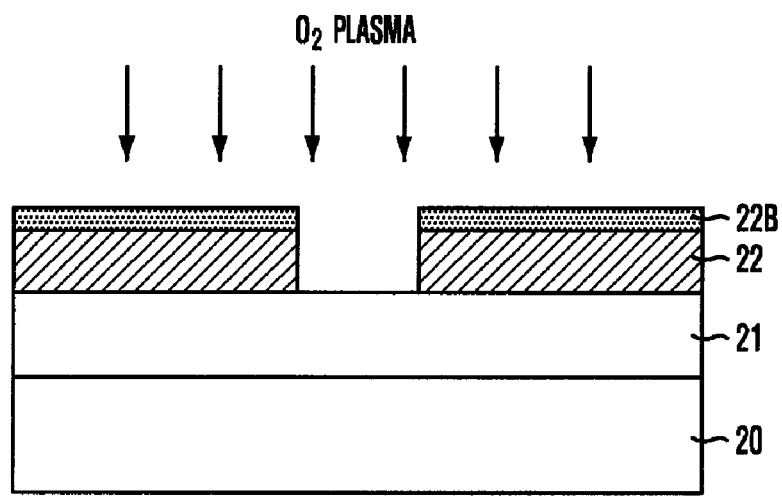

Referring to FIG. 2C, a development process is performed to pattern the photoresist 22A, and an oxygen $O_2$ plasma process is performed to oxidize the doped region 22A. In this case, when boron (B) is used as the dopants, the oxide layer 22B formed by oxidizing the doped region 22A has a form of $B_2O_3$; and when arsenic (As) is used as the dopants, the oxide layer 22B has a form of $As_2O_3$.

Figure 2D:
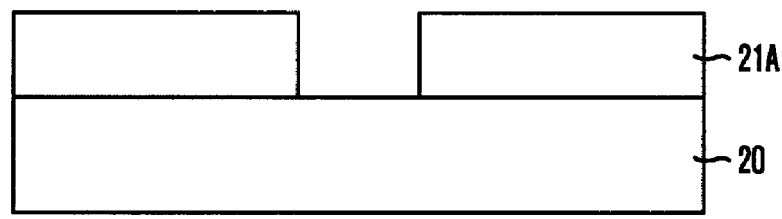

Referring to FIG. 2D, a dry etching process is performed on the interlayer insulation layer 21 using the photoresist pattern 22, on which the oxide layer 22B is formed, as an etch barrier. A reference numeral 21A represents a finally patterned interlayer insulation layer.

Through the above-mentioned processes, the oxide layer 22B formed on the photoresist 22 can ensure a sufficient etch selectivity during the etching of the interlayer insulation layer 21 such as the silicon nitride layer or the silicon oxide layer, and thus the oxide layer 22B can serve as the etch barrier.

FIGS. 3A to 3F illustrate a method for fabricating a fine pattern in accordance with another embodiment of the present invention.

Figure 3A:
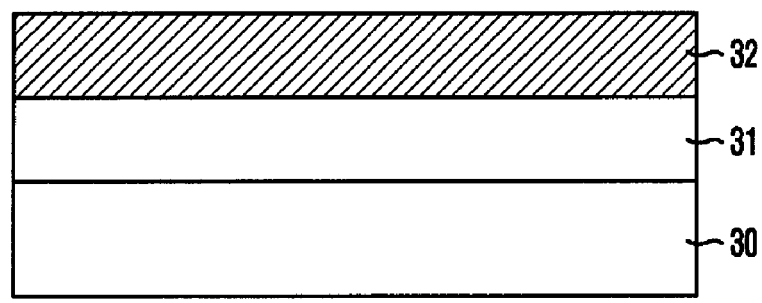
FIGS. 3A to 3F illustrate a method for fabricating a fine pattern in accordance with another embodiment of the present invention.

Referring to FIG. 3A, after a predetermined process is completed, a photoresist 32 is formed over a substrate 30 where an interlayer insulation layer 31 such as a silicon oxide layer or a silicon nitride layer is formed as an etch target layer.

Figure 3B:
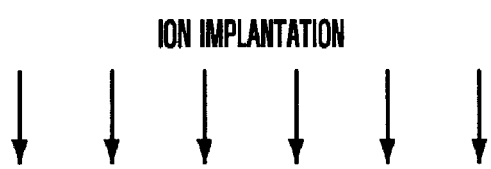
Figure 3B:
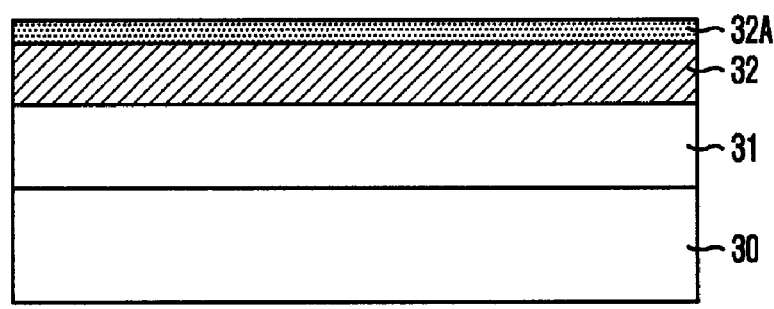

Referring to FIG. 3B, at least one impurity selected from the group consisting of boron (B), indium (In), phosphorus (P), and arsenic (As) is implanted into the photoresist 32. In this case, a dose of the impurity is more than approximately $1*10^{13}/cm^2$, and ion implantation energy is more than approximately 5 KeV. After the ion implantation, an annealing process may be performed for diffusing dopants. A reference numeral 32A represents a doped region.

Figure 3C:
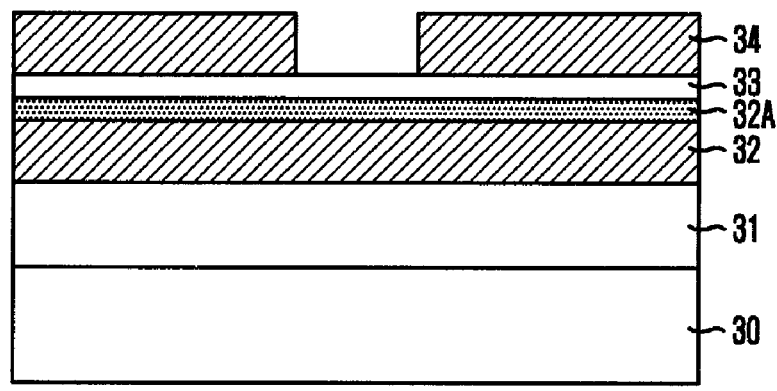

Referring to FIG. 3C, an organic bottom anti-reflective coating (BARC) 33 is formed and a photoresist is formed thereon. An exposure process and a development process are performed to form a photoresist pattern 34.

Figure 3D:
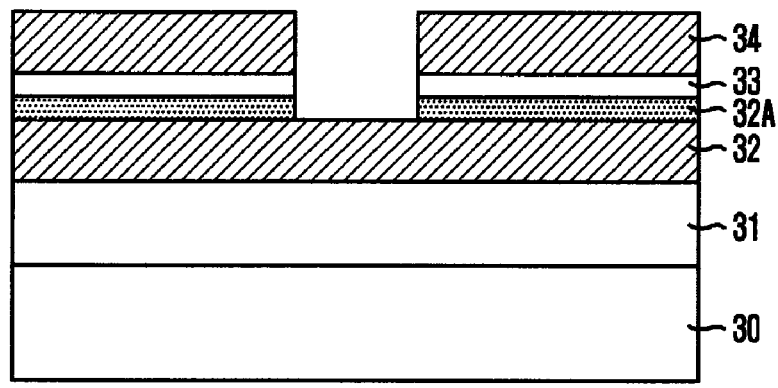

Referring to FIG. 3D, the organic anti-reflective coating 33 and the doped region of the photoresist 32 are dry etched by using a fluorine (F) containing gas. The fluorine containing gas includes one selected from the group consisting of $CF_4$, $CHF_3$, $SF_6$, $NF_3$, and a combination thereof, and a total gas flow rate is in a range of approximately 1 sccm to approximately 1,000 sccm. Also, a process pressure is in a range of approximately 10 mT to approximately 800 mT, a substrate temperature is in a range of approximately 10 C to approximately 100 C, and a process power is in a range of approximately 50 W to approximately 2,000 W.

Figure 3E:
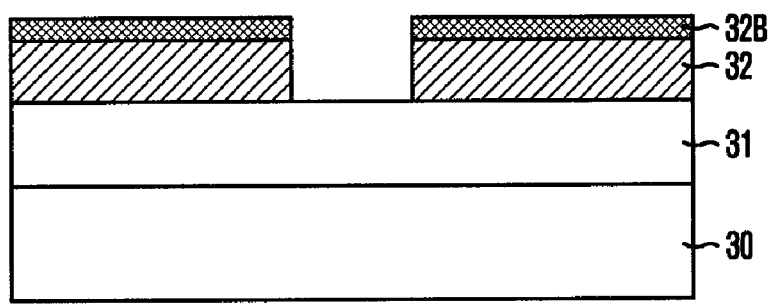

Referring to FIG. 3E, a dry etching process for removing the photoresist is performed using an oxygen (O) containing gas. The oxygen containing gas includes $O_2$ or $O_3$, and plasma is formed under environments of low temperature less than approximately 100 C and low pressure less than approximately 200 mT.

Through the above process, the photoresist pattern 34 and the organic bottom anti-reflective coating 33 are removed, the exposed photoresist 32 is patterned, and the doped region 32A of the photoresist 32 is oxidized to form an oxide layer 32B.

Figure 3F:
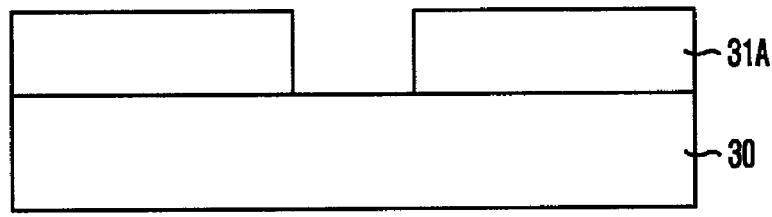

Referring to FIG. 3F, a dry etching process is performed on the interlayer insulation layer 31 using the photoresist pattern, on which the oxide layer 32B is formed, as an etch barrier. A reference numeral 31A represents a finally patterned interlayer insulation layer.

Through these processes, the oxide layer 32B formed on a surface of the photoresist 32 can ensure a sufficient etch selectivity during the etching of the interlayer insulation layer 31 such as the silicon nitride layer or the silicon oxide layer, and thus the oxide layer 32B can serve as the etch barrier.

After the process described with reference to FIG. 3B, that is, after the ion implantation, a subsequent process can be performed in such a state that the oxide layer is previously formed on the photoresist 32 by performing an oxidation process such as an $O_2$ plasma process on the photoresist 32. That is, the barrier oxide layer can be formed before the mask process. In this case, during the dry etching process for removing the photoresist, use of an oxygen-based gas may be avoided.

In accordance with the embodiments of the present invention, the etch profile for the thick etch target layer can be ensured without using the hard mask such as the amorphous carbon layer. Furthermore, the fabricating process is simplified because additional processes such as a bevel etching process or a mask alignment key open process are not performed.

While the present invention has been described with respect to the disclosed embodiments, it will be apparent to those skilled in the art that various changes and modifications may be made without departing from the spirit and scope of the invention as defined in the following claims.

Although it has been described above that the impurity is doped into the photoresist by the ion implantation, the present invention can also be applied to a plasma doping method.

Furthermore, although it has been described above that the photoresist is exposed to the plasma in order to form the oxide layer thereon, an annealing method under an oxygen atmosphere can also be used.

Moreover, the organic bottom anti-reflective coating may be omitted because it is an auxiliary material layer.

What is claimed is:

1. A method for fabricating a fine pattern in a semiconductor device, the method comprising:
    forming a first photoresist over a substrate where an etch target layer is formed;
    doping at least one impurity selected from group III and group V elements into the first photoresist;
    forming a photoresist pattern over the first photoresist;
    performing a dry etching process using the photoresist pattern to expose the first photoresist;
    etching the first photoresist by an oxygen-based dry etching to form a first photoresist pattern where a doped region is oxidized; and
    etching the etch target layer using the first photoresist pattern as an etch barrier.

2. The method of claim 1, wherein the forming of the photoresist pattern comprises:
    forming a bottom anti-reflective coating over the first photoresist;
    forming a second photoresist over the bottom anti-reflective coating; and
    performing an exposure process and a development process on the second photoresist.

3. The method of claim 1, wherein the impurity is selected from the group consisting of boron (B), indium (In), phosphorus (P), and arsenic (As).

4. The method of claim 1, wherein the impurity is doped by an ion implantation process.

5. The method of claim 1, wherein the impurity is doped by a plasma doping process.

6. The method of claim 4, wherein the doping of the impurity comprises performing an annealing process for diffusing the impurity doped by the ion implantation process.

7. The method of claim 1, wherein the etch target layer comprises a silicon oxide layer or a silicon nitride layer.

8. The method of claim 2, wherein the performing of the dry etching process comprises etching the exposed bottom anti-reflective coating and the doped region of the first photoresist by using a fluorine (F) containing gas and the photoresist pattern as an etch barrier.

* * * * *